(12) United States Patent
Trout

(10) Patent No.: US 6,753,474 B2
(45) Date of Patent: Jun. 22, 2004

(54) PICK AND PLACE COVER FOR MULTIPLE TERMINAL ELECTRONIC COMPONENTS

(75) Inventor: David A. Trout, Wrightsville, PA (US)

(73) Assignee: Tyco Electronics Corporation, Middletown, PA (US)

( * ) Notice: Subject to any disclaimer, the term of this patent is extended or adjusted under 35 U.S.C. 154(b) by 3 days.

(21) Appl. No.: 10/245,971

(22) Filed: Sep. 18, 2002

(65) Prior Publication Data

US 2004/0053524 A1 Mar. 18, 2004

(51) Int. Cl.$^7$ ............................ H02G 3/14; H01R 13/44
(52) U.S. Cl. ..................... 174/66; 174/138 F; 439/135; 439/940
(58) Field of Search ........................... 174/66, 138 F; 439/135, 148, 149, 259, 342, 265, 263, 266, 268, 940

(56) References Cited

U.S. PATENT DOCUMENTS

| | | | |
|---|---|---|---|
| 4,396,245 A | 8/1983 | Lane | 339/38 |
| 5,026,295 A | 6/1991 | Fong et al. | 439/135 |
| 5,055,971 A | 10/1991 | Fudala et al. | 361/400 |
| 5,242,311 A | 9/1993 | Seong | 439/135 |
| 5,249,977 A | 10/1993 | Tanaka et al. | 439/135 |
| 5,277,601 A | 1/1994 | Miyazawa | 439/135 |
| 5,361,492 A | 11/1994 | Miyazawa | 29/879 |
| 5,383,797 A | 1/1995 | Seong et al. | 439/476 |
| 5,567,177 A * | 10/1996 | Foerstel et al. | 439/526 |
| 5,681,174 A | 10/1997 | Correll, Jr. et al. | 439/135 |
| 5,810,611 A * | 9/1998 | Campagnon | 439/149 |
| 6,155,848 A | 12/2000 | Lin | 439/135 |
| 6,168,444 B1 | 1/2001 | Wu et al. | 439/135 |
| 6,174,171 B1 | 1/2001 | Fu | 439/41 |
| 6,287,127 B1 * | 9/2001 | Hibino et al. | 439/70 |
| 6,371,776 B1 | 4/2002 | Li et al. | 439/135 |
| 6,413,111 B1 | 7/2002 | Pickles et al. | 439/342 |
| 6,530,798 B1 * | 3/2003 | Li et al. | 439/342 |
| 6,533,592 B1 * | 3/2003 | Chen et al. | 439/135 |
| 6,554,625 B1 * | 4/2003 | Liao et al. | 439/135 |
| 6,572,383 B1 | 6/2003 | Yu | 439/41 |

* cited by examiner

*Primary Examiner*—Dean Reichard
*Assistant Examiner*—Angel R. Estrada

(57) ABSTRACT

A cover assembly is provided that includes an electronic socket with a socket cover having a bottom surface. The cover assembly includes a transport cover with a top surface and bottom surface. The top surface is configured to form a vacuum seal with a tool, and the bottom surface includes a locating post and a flexible beam with a protusion. The locating post is configured to engage the socket cover. The flexible beam is biased by the socket cover such that the protrusion releasably engages the bottom surface of the socket cover retain the transport cover to the socket cover.

25 Claims, 6 Drawing Sheets

PICK AND PLACE COVER FOR MULTIPLE TERMINAL ELECTRONIC COMPONENTS

BACKGROUND OF THE INVENTION

The present invention generally relates to a cover for transporting and protecting electronic components. More particularly, the present invention relates to a removable cover securable to an electronic socket for transporting an electronic socket, such as to a circuit board during assembly.

Many types of electronic sockets exist today. These sockets typically include a socket base, to which a socket cover is slidably mounted. The socket base and cover are formed with grids of pin holes therein, with the grids in the base and cover overlapping. The socket cover may be slid between open and closed positions with respect to the socket base. The pin holes in the socket base include receptacle contacts having pins extending from the bottom of the socket. A pin pattern on the socket base is configured to align with an array of holes in a support structure to which the socket is mounted, such as a circuit board. The socket cover has a pin hole pattern configured to receive pins on a mating component, such as a microprocessor. The socket base and cover also include a large clearance hole through the centers thereof.

The sockets are typically mounted to the circuit board through an automated process. However, the socket may easily be damaged or contaminated when manipulated, and thus transporting the socket from a shipping tray to the circuit board and positioning the socket on the circuit board is a difficult task.

Past automated assembly processes have used a vacuum tool to form a vacuum seal with the electronic socket and to transport the electronic socket to the circuit board. However, because the socket has numerous pin holes and the clearance hole which prevent the formation of a vacuum seal thereon, an additional transport cover is attached to the socket cover. The vacuum tool forms the vacuum seal with the transport cover and collectively moves the electronic socket to the circuit board. Once the socket is in place on the circuit board, the transport cover is removed.

Several kinds of covers have been proposed to facilitate transportation and installation of an electronic socket. For example, a tape or film has been applied to the top of the socket cover to cover the pin holes and the clearance hole. The tape provides a semi-rigid, uninterrupted surface on the top of the socket in order that the vacuum tool may form a seal on the tape and facilitate transport of the socket to a circuit board. Once the socket is soldered to the circuit board, the tape is then removed from the socket. However, the tape is expensive and is not reusable. Additionally, the tape is difficult to center and apply on the socket and is difficult to remove by hand or with a tool because the tape has no surface for gripping.

Another transport cover used in the industry is described in U.S. Pat. No. 6,155,848. The '848 patent describes a plastic cover that has a body with a flat top surface and supporting legs perpendicularly extending from opposite lateral edges of the body. The supporting legs have stand-off portions perpendicularly extending inward therefrom to define a gap. The supporting legs are biased outward from each other or slid alongside the side walls of the electronic socket such that stand-off portions extend under the body of the electronic socket and retain the transport cover to the electronic socket. The vacuum tool is then used to form a vacuum seal with the top surface of the transport cover and transport the electronic socket to the motherboard.

The plastic transport cover suffers from several drawbacks. First, the transport cover is difficult to install onto the electronic socket. The transport cover either must be slid onto the electronic socket with the stand-offs reaching under the electronic socket and holding the electronic socket in the gap or the supporting legs must be biased outward away from each other such that the stand-offs can be snapped under the electronic socket. Sliding the transport cover onto the electronic socket requires aligning the electronic socket within the gap, which can be difficult and time consuming. Likewise, snapping the transport cover on and off of the electronic socket is time consuming because the supporting legs are small and difficult to grip or position.

A need remains for a transport cover that overcomes the above problems and addresses other concerns experienced in the prior art.

BRIEF SUMMARY OF THE INVENTION

Certain embodiments of the present invention include a socket assembly having an electronic socket with a socket cover. The socket assembly also includes a transport cover with a top surface and a bottom surface. The top surface of the transport cover is configured to form a vacuum seal with a tool, while the bottom surface of the transport cover includes a locating post and a flexible beam with a latching protrusion. The locating post is configured to slidably engage a clearance hole through the socket cover. The flexible beam is received in the clearance hole in the socket cover until the latching protrusion releasably engages a bottom surface of the socket cover to retain the transport cover on the socket cover.

Figure 1:
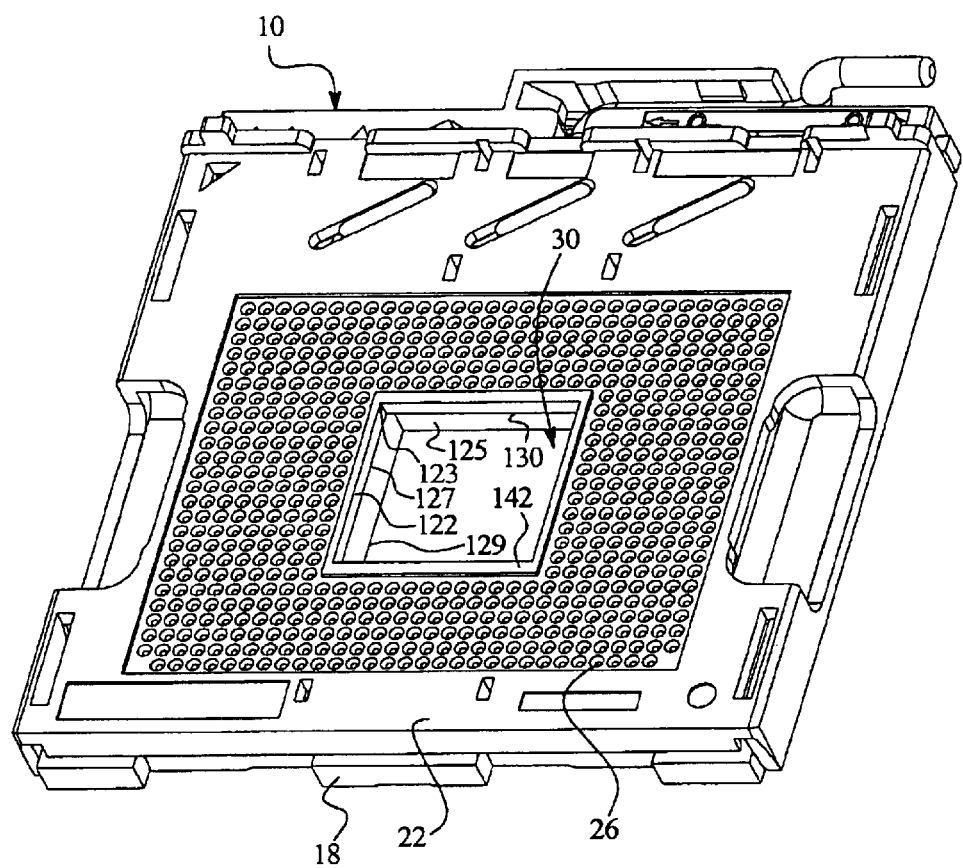
FIG. 1 illustrates an isometric view of an electronic socket used with an embodiment of the present invention.

The foregoing summary, as well as the following detailed description of certain embodiments of the present invention, will be better understood when read in conjunction with the appended drawings. For the purpose of illustrating the invention, there is shown in the drawings, certain embodiments. It should be understood, however, that the present invention is not limited to the arrangements and instrumentality shown in the attached drawings.

DETAILED DESCRIPTION OF THE INVENTION

FIG. 1 illustrates an isometric view of an electronic socket 10 used with an embodiment of the present invention. The electronic socket 10 includes an insulated socket base 18 containing metal contact pins (not shown) in an array of holes. The pins extend from the bottom of the electronic socket 10. An insulated socket cover 22 is slidably mounted to the socket base 18 and has an array of pin holes 26 that correspond to, and (when open) align with, the array of holes in the socket base 18. The electronic socket 10 is connected to a circuit board, for example a motherboard, by soldering the contact pins in the socket base 18 to traces on the circuit board. The socket cover 22 is configured to receive pins from a mating electronic component, such as a microprocessor. The socket cover 22 slides relative to the socket base 18 to bind the pins of the microprocessor in the pin holes 26. The pins of the microprocessor extend into, and engage the pins in the pin holes in the socket base 18.

The electronic socket 10 includes a square clearance window 30 that extends therethrough. The clearance window 30 is defined by planar, non-recessed cover interior walls 122 formed in the socket cover 22 and planar non-recessed base interior walls 125 formed in the socket base 18. The cover interior walls 122 intersect at smooth, right-angle corners 123, as do the base interior walls 125. The cover interior walls 122 of the socket cover 22 are formed with top and bottom surfaces 142 and 130. The base interior walls 125 of the socket base 18 have top and bottom surfaces 127 and 129. The top and bottom surfaces 127, 129, 142 and 130 are even and planar proximate the clearance window 30, and form uninterrupted and continuous edges at the cover and base interior walls 122 and 125, and do not include recesses or notches. The clearance window 30 provides clearance for other electronic components when the electronic socket 10 is connected to the circuit board.

Figure 2:
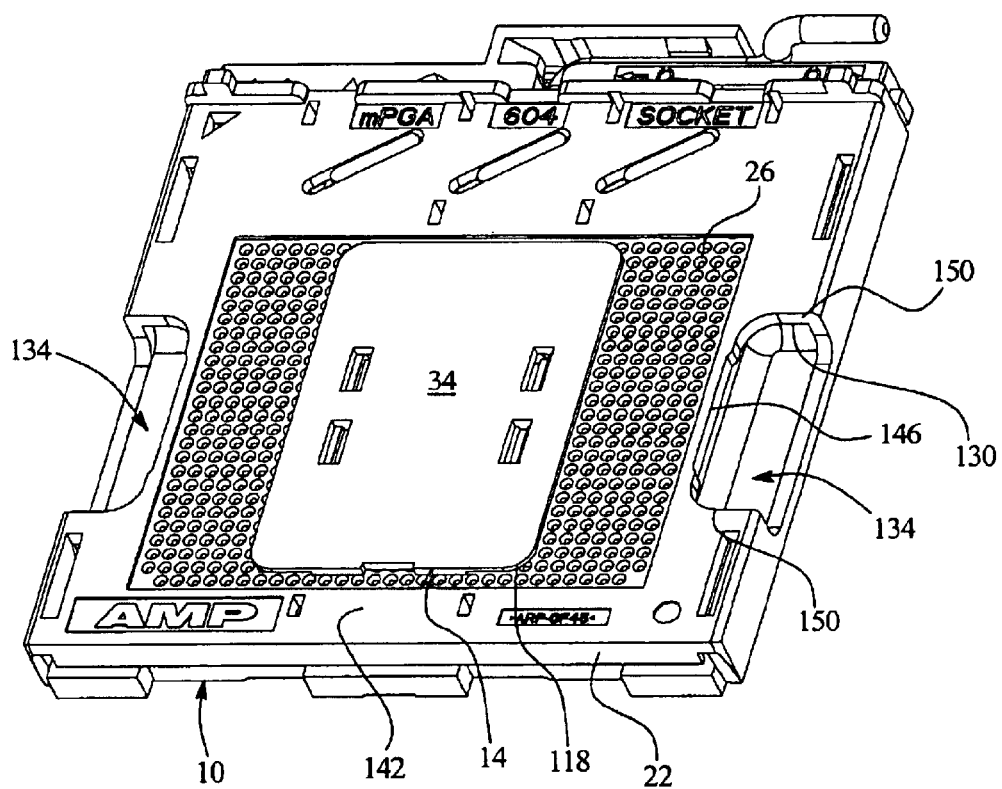
FIG. 2 illustrates a top isometric view of an electronic socket with a transport cover mounted thereto according to an embodiment of the present invention.

FIG. 2 illustrates a top isometric view of the electronic socket 10 with a transport cover 14 mounted thereto. The clearance window 30 (FIG. 1) receives the transport cover 14. The transport cover 14 has a planar body with a flat top surface 34 that provides a rigid, uninterrupted engagement surface with which a vacuum tool (not shown) forms a vacuum seal. Upon forming the vacuum seal on the top surface 34, the vacuum tool is used to transport the transport cover 14 (and thus the electronic socket 10) to the circuit board with minimal contamination or turbulence. The electronic socket 10 is then soldered to the circuit board. Optionally, the transport cover 14 may be made large enough to cover all or a portion of the array of pin holes 26 on the socket cover 22. The socket cover 22 has cutouts 134 at opposite sides. Each cutout 134 has a side edge wall 146 and opposite end edge walls 150 extending from a top surface 142 of the socket cover. The end edge walls 150 have bottom surfaces 130.

Figure 3:
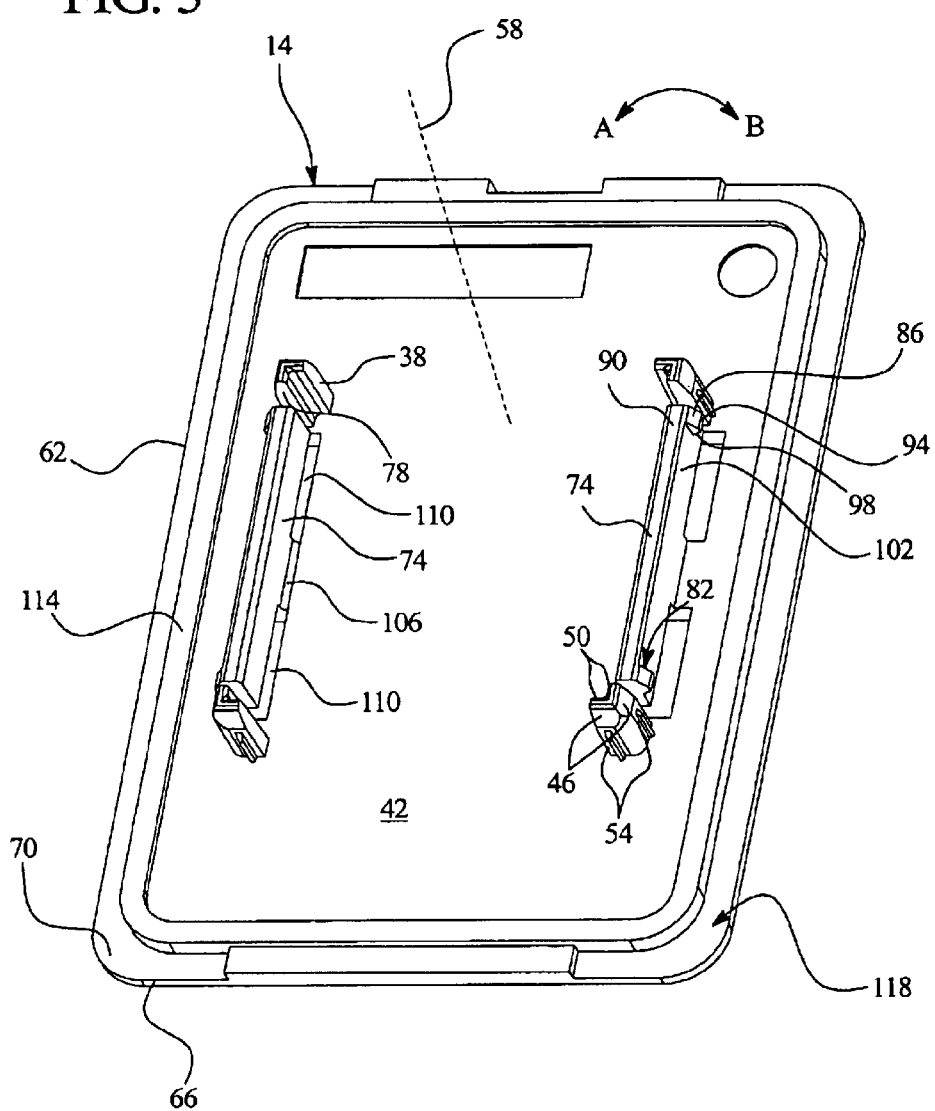
FIG. 3 illustrates a bottom isometric view of a transport cover formed according to an embodiment of the present invention.

FIG. 3 illustrates a bottom isometric view of the transport cover 14. The transport cover 14 has side walls 62 and end walls 66 connected by rounded corners 70. Multiple locating posts 38 are formed on a bottom surface 42 of the transport cover 14 proximate to the side walls 62. The locating posts 38 are arranged to define four corners of a square or rectangle. The locating posts 38 are elbow shaped and have tapered edges 46 that are formed with, and extend between, top edges 50 and side walls 54 at an acute angle to a vertical axis 58 oriented perpendicular to the bottom surface 42. The locating posts 38 properly align the transport cover 14 within the clearance window 30 (FIG. 1) when the transport cover 14 is connected to the electronic socket 10 (FIG. 1). In the example of FIG. 3, the locating posts 38 are arranged in pairs located adjacent opposite side walls 62.

A long rectangular latch beam 74 is located between each pair of locating posts 38 and extends proximate a corresponding side wall 62. The height of the locating posts 38 along the vertical axis 58 is greater than the height of the latch beams 74, in order that the locating posts 38 are first to engage the clearance window 30. The latch beams 74 are connected to the bottom surface 42 by intermediate strips 106 which retain the latch beams 74 above molding gaps 110. The latch beams 74 extend between, but are not connected to, interior walls 78 of the locating posts 38. The strips 106 permit the latch beams 74 to flex in the directions of arrows A or B toward and away from one another. The molding gaps 110 provide a clearance for molding the latch beams 74 during manufacturing of the transport cover 14.

Alternatively, the latch beams 74 may extend parallel to the end walls 66. Optionally, fewer or more than four locating posts 38 may be used.

Each latch beam 74 is formed with protrusions 82 at opposite ends extending outward from side surfaces 102. The protrusions 82 extend outward from each latch beam 74 toward the proximate side wall 62 of the transport cover 14. Each protrusion 82 has a beveled surface 86 extending from a bottom surface 90 of the latch beam 74 to a retention wall 94. Each protrusion 82 also has a tapered latch surface 98 extending from the side surface 102 of the latch beam 74. The protrusions 82 snapably engage the electronic socket 10 (FIG. 1) when the latch beams 74 are inserted into the clearance window 30 (FIG. 3) to retain the transport cover 14 on the electronic socket 10.

A continuous contact rib 114 extends about the perimeter of the bottom surface 42 and is offset inward from the side and end walls 62 and 66. The contact rib 114 sits on the socket cover 22 (FIG. 1) when the transport cover 14 is connected to the socket cover 22 such that the socket cover 22 and the transport cover 14 are snugly fitted against each other. Thus the contact rib 114 prevents the electronic socket 10 (FIG. 1) from hanging loosely from the transport cover 14 in a manner that could damage the electronic socket 10.

Because the contact rib 114 extends upward from the bottom surface 42 along vertical axis 58, the transport cover 14 forms relief areas 118 outside the contact rib 114 proximate the side and end walls 62 and 66. The relief areas 118 represent gaps between the transport cover 14 and socket cover 22 that allow an operator to grip the transport cover 14 by hand or a tool to remove the transport cover 14 from the socket cover 22 (FIG. 1).

Figure 4:
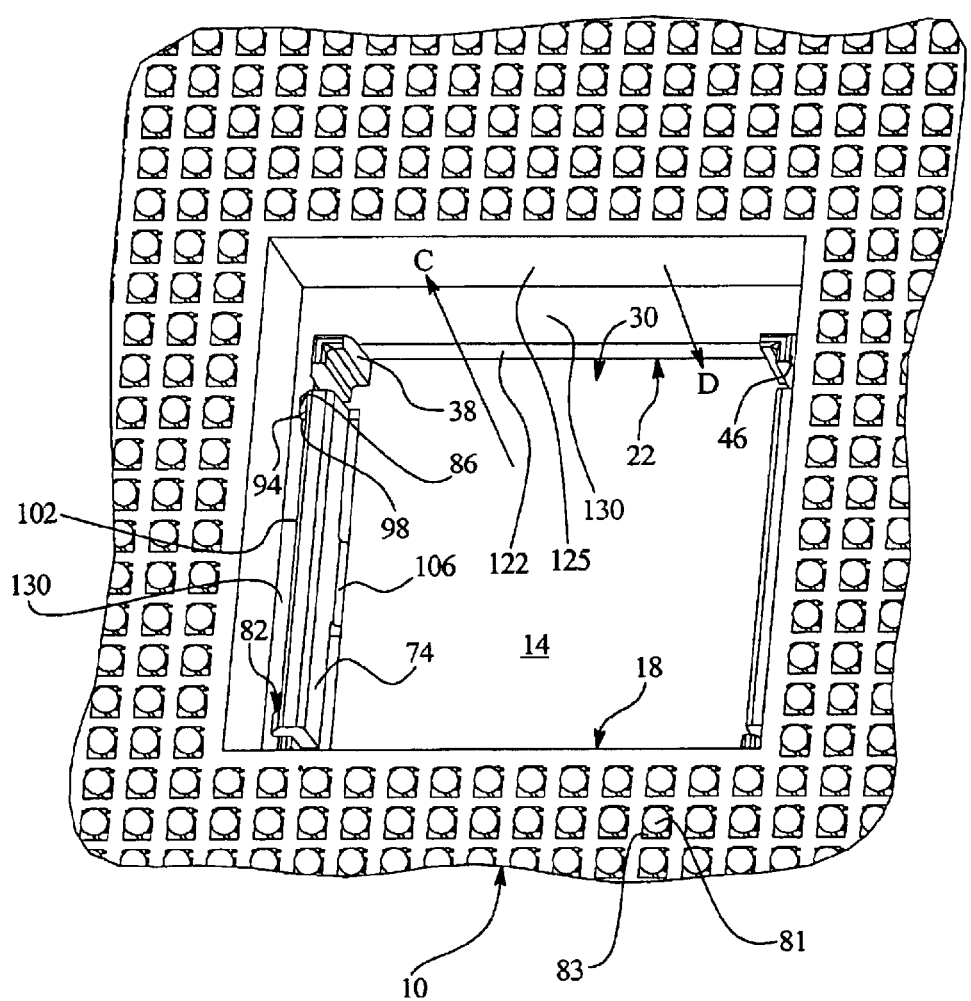
FIG. 4 illustrates a bottom isometric view of a portion of a transport cover and an electronic socket formed according to an embodiment of the present invention.

FIG. 4 illustrates a bottom isometric view of a portion of the electronic socket 10 with the transport cover 14 positioned to be attached. Metal pins 81 are retained in an array of pin holes 83 in the socket base 18 and are aligned with the pin holes 26 (FIG. 1) of the socket cover 22. The socket base and cover 18 and 22 are aligned such that the cover interior walls 122 are offset from the base interior walls 125. When the cover interior walls 122 and the base interior walls 125 are offset, as shown in FIG. 4, the bottom surface 130 of the socket cover 22 surrounding the clearance window 30 forms a ledge. By way of example, the cover interior walls 122 may be dimensional to form an interior envelope for the clearance window 30 that is smaller than the interior envelope formed between the base interior walls 125.

When the transport cover 14 is inserted into the clearance window 30 of the socket cover 22, the latch beams 74 engage the cover interior walls 122 and the locating posts 38 are retained in the corners 123 (FIG. 1). In operation, the transport cover 14 is connected to the socket cover 22 by inserting the locating posts 38 downward into the clearance window 30 in the direction of arrow C such that the locating posts 38 slide along the cover interior walls 122 at the corners 123 (FIG. 1). The tapered edges 46 allow for the locating posts 38 to be slidably inserted into the corners 123 with little resistance and provide a greater tolerance for initially fitting the locating posts 38 into the clearance window 30. Because the locating posts 38 extend further from the bottom surface 42 than the latch beams 74, the locating posts 38 guide the transport cover 14 into the clearance window 30 such that the latch beams 74 are properly aligned within the clearance window 30 to engage the cover interior walls 122.

As the latch beams 74 are inserted into the clearance window 30, the beveled surfaces 86 of the protrusions 82 ride over, and are resistibly engaged by, the cover interior walls 122 until the protrusions 82 are biased inward toward each other. As the transport cover 14 is further inserted into the socket cover 22, the retention walls 94 slide past the cover interior walls 122 until the retention walls 94 snap past the cover interior walls 122 and the latch surfaces 98 engage the bottom surface 130. When the latch surfaces 98 clear the cover interior walls 122, the latch beams 74 return to their unbiased positions with the side surfaces 102 engaging the cover interior walls 122 and the latch surfaces 98 of the protrusions 82 engaging the bottom surface 130 of the socket cover 22. Once the latch surfaces 98 engage the bottom surface 130 of the socket cover 22, the contact rib 114 (FIG. 3) is seated on a top surface 142 (FIG. 1) of the socket cover 22. A vacuum tool may then be used to form a vacuum seal on the top surface 34 (FIG. 2) of the transport cover 14 and transport the electronic socket 10 to a printed circuit board.

The transport cover 14 is removed from the socket cover 22 by inserting a tool or fingernail into the relief areas 118 (FIG. 3) to pry the transport cover 14 out of the clearance window 30. As the transport cover 14 is pulled out of the clearance window 30 in the direction of arrow D, the latch surfaces 98 slide by, and are resistibly engaged by, the cover interior walls 122 causing the latch beams 74 to be biased inward toward each other until the protrusions 82 slide fully past, and no longer engage, the cover interior walls 122. The latch beams 74 then flex back to their unbiased position as the transport cover 14 is fully removed from the clearance window 30.

Figure 5:
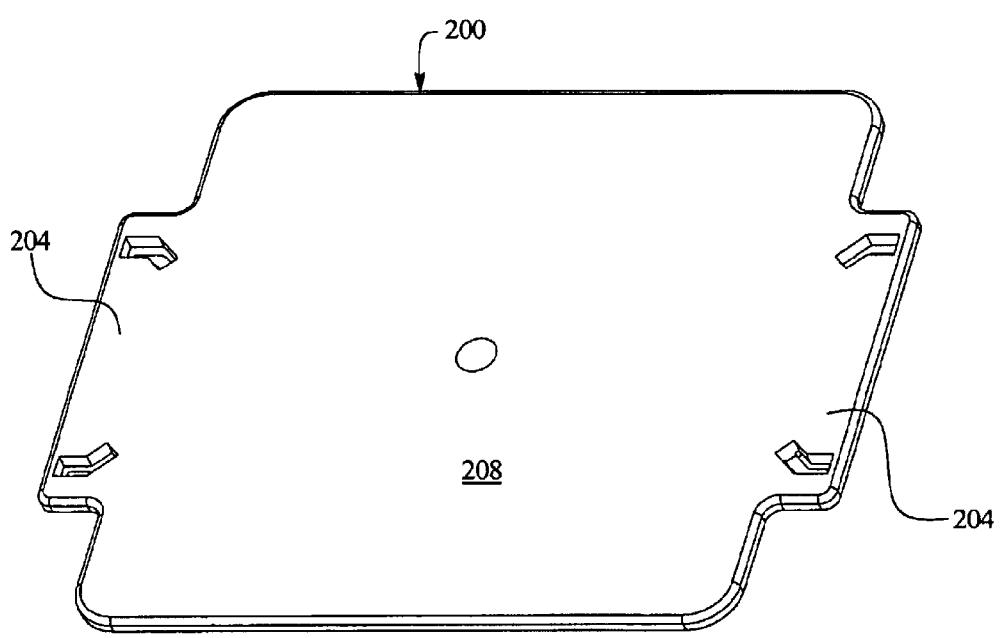
FIG. 5 illustrates a top isometric view of a transport cover formed in accordance with an alternative embodiment of the present invention.

FIG. 5 illustrates a top isometric view of a transport cover 200 formed in accordance with an alternative embodiment of the present invention. The transport cover 200 has panels 204 extending from opposite sides thereof. The transport cover 200 has a flat, uninterrupted top surface 208 that forms a vacuum seal with a vacuum tool.

Figure 6:
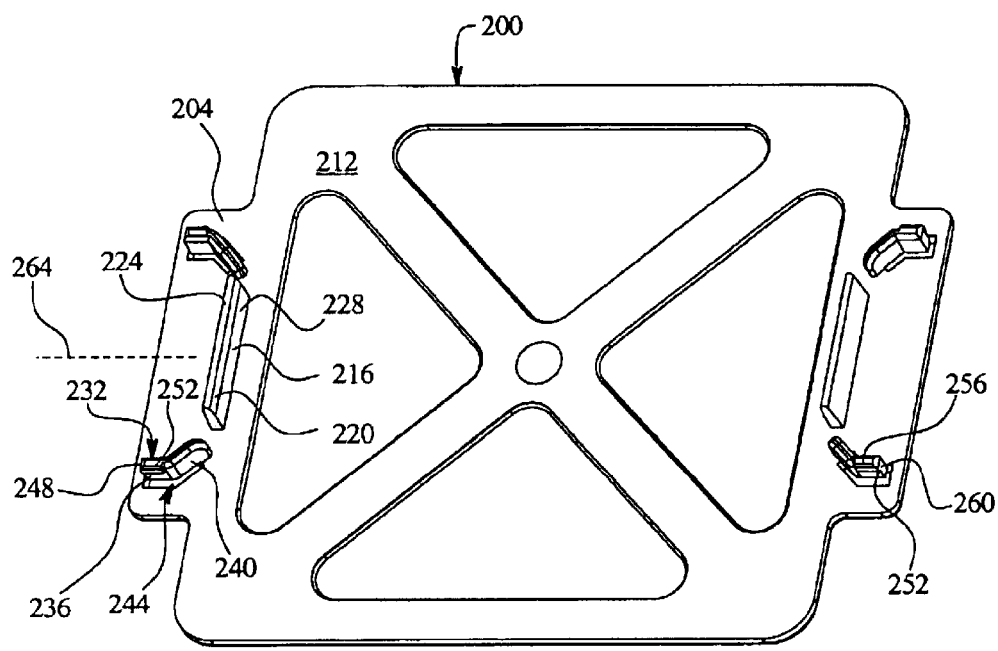
FIG. 6 illustrates a bottom isometric view of the transport cover of FIG. 5.

FIG. 6 illustrates a bottom isometric view of the transport cover 200 of FIG. 5. Locating posts 216 extend from a bottom surface 212 of the transport cover 200 at the panels 204. The locating posts 216 are rectangular with tapered walls 220 extending from top walls 224 to interior walls 228. Pairs of flexible beams 232 extend from the bottom surface 212 of the panels 204 on opposite sides of the locating posts 216. The flexible beams 232 are elbow shaped with first walls 236, and oriented at an angle to, second walls 240. The first walls 236 of a pair of flexible beams 232 are parallel to each other. The flexible beams 232 partially extend from the bottom surface 212 over beam gaps 244 situated in the panels 204. The flexible beams 232 may therefore be biased sideways, thereby rocking into the beam gaps 244.

The first walls 236 of each pair of flexible beams 232 on a panel 204 have protrusions 248 extending outward away from each other. The protrusions 248 have tapered top and bottom walls 252 and 256 extending from a resistance wall 260.

In operation, the transport cover 200 is inserted onto the socket cover 22 (FIG. 1) by positioning the panels 204 over the cutouts 134 (FIG. 2) such that the locating posts 216 slidably engage the side edge walls 146 (FIG. 2) of the cutouts 134 and the first walls 236 of the flexible beams 232 slidably engage the end edge walls 150 (FIG. 2) of the cutouts 134. The locating posts 216 and the flexible beams 232 guide the transport cover 200 into the cutouts 134 such that the transport cover 200 covers the entire array of pin holes 26 (FIG. 1) on the socket cover 22. The locating posts 216 and second walls 240 tightly engage the side edge walls 146 in order to prevent the first walls 236 from loosely sliding along a longitudinal axis 264 against the end edge walls 150.

As the transport cover 200 is further inserted onto the socket cover 22 (FIG. 1), the protrusions 248 slidably engage, and are resisted by, the end edge walls 150 (FIG. 1) of the cutouts 134 (FIG. 1). As the bottom walls 256 and resistance walls 260 engage the end edge walls 150, the flexible beams 232 on each panel 204 are biased inward toward each other into the beam gaps 244. As the tapered top walls 252 slide past the end edge walls 150, the flexible beams 232 on a panel 204 flex away from each other toward their unbiased position. When the protrusions 248 have been fully slid past the end edge walls 150, the top walls 252 of the protrusions 248 snapably engage the bottom surfaces 130 (FIG. 1) of the end edge walls 150 such that the transport cover 200 is tightly retained on top of the socket cover 22. Because the transport cover 200 covers the array of pin holes 26 (FIG. 1), the transport cover 200 not only provides a rigid surface for forming a vacuum seal with a vacuum tool, but also prevents dust and other contaminants from getting into the pin holes 26 and thus possibly affecting the pins.

The transport cover 200 may be removed from the electronic socket 10 (FIG. 1) by pulling the panels 204 out of the cutouts 134 (FIG. 2) such that the flexible beams 232 on each panel 204 are biased inward toward each other and the protrusions 248 are snapped past the end edge walls 150 (FIG. 2).

The transport covers of the various embodiments provide several advantages. First, the transport covers are cheap to produce and are reusable. Therefore, the transport covers are more cost effective than using tape as a cover. Also, the transport covers can be connected to a standard socket cover. Further, the transport covers are easy to install because the locating posts are slid vertically into corners and alongside walls in the socket cover without need of sliding or snapping supporting legs about the electronic socket. Finally, at least one of the embodiments of transport covers is large enough to cover the entire array of pin holes on the socket cover in order to protect the pins and pin holes from airborne contaminants.

While the invention has been described with reference to certain embodiments, it will be understood by those skilled in the art that various changes may be made and equivalents may be substituted without departing from the scope of the invention. In addition, many modifications may be made to adapt a particular situation or material to the teachings of the invention without departing from its scope. Therefore, it is intended that the invention not be limited to the particular embodiment disclosed, but that the invention will include all embodiments falling within the scope of the appended claims.

What is claimed is:

1. A transport cover connectable to an electrical socket having a socket cover with a window therethrough, the window being surrounded by interior walls intersecting at corners, the transport cover comprising:

a body having a top surface configured to be engaged by a transport tool and having a bottom surface configured to abut against a surface of an electronic socket;

locating posts provided on said bottom surface of said body, said locating posts being positioned on said body and separated from one another to align with at least two of said corners of said window; and latch beams provided on said bottom surface of said body, said latch beams being positioned on said body and separated from one another to align with at least two of said interior walls, said latch beams being configured to snappably engage a bottom surface of said socket cover proximate corresponding interior walls.

2. The transport cover of claim 1, wherein said latch beams have locking protrusions extending outward from exterior side surfaces of said latch beams, said locking protrusions being spaced from said body by a distance sufficient for said locking protrusions to clear said interior walls of said window and engage said bottom surface of said socket cover.

3. The transport cover of claim 1, wherein said latch beams have locking protrusions extending outward from exterior side surfaces of said latch beams, said locking protrusions latching over said bottom surface of said socket cover and said exterior side surfaces abutting against said interior walls of said window when said transport cover is attached to said socket cover.

4. The transport cover of claim 1, wherein said transport latch beams include outwardly projecting protrusions having tapered latch surfaces that slide along, and are resistibly engaged by, said interior walls of said window when said transport cover is inserted into said window such that said latch beams are biased away from said interior walls.

5. The transport cover of claim 1, wherein said latch beams extend parallel to each other and are configured to latch to opposite interior walls of said window.

6. The transport cover of claim 1, wherein said locating post includes tapered outer edges that slide along said corners of said window to align said transport cover within said window.

7. The transport cover of claim 1, wherein said latch beams are connected to said bottom surface of said body by thin flexible strips that bend in a lateral direction with respect to a length of said latch beams.

8. The transport cover of claim 1, wherein said latch beams include latch surfaces that project past interior walls of the window, said latch surfaces engaging the bottom surface of the socket cover after clearing the interior walls of the window.

9. An electronic socket assembly, comprising:

a socket having a socket base slidably mounted to a socket cover, said socket cover having a window formed therein and extending between top and bottom surfaces of said socket cover, said window including interior walls that join at corners of said window; and a transport cover detachably mounted to said socket, said transport cover having a bottom surface with a locating post and a latch beam thereon, said locating post being received within said window proximate a corner of said interior walls, said corner being formed by adjoining continuous and uninterrupted portions of said interior walls, said latch beam snappably engaging said bottom surface of said socket cover proximate a continuous and uninterrupted portion of said interior wall.

10. The electronic socket assembly of claim 9, wherein said latch beam includes a protrusion extending outward from a side of said latch beam, said protrusion extending past said interior wall and securely engaging said bottom surface of said socket cover.

11. The electronic socket assembly of claim 9, wherein said latch beam includes at least first and second protrusions extending outward from a side of said latch beam, said first and second protrusions being located at opposite ends of said latch beam, said protrusions securely engaging said bottom surface of said socket cover.

12. The electronic socket assembly of claim 9, further comprising first and second latch beams provided on said bottom surface of said transport cover, said latch beams being aligned parallel to one another and facing in opposite directions to engage said bottom surface of said socket cover proximate corresponding opposed interior walls of said window.

13. The electronic socket assembly of claim 9, further comprising a plurality of said locating posts arranged to be received within corresponding corners of said window.

14. The transport cover of claim 9, wherein said latch beams have locking protrusions extending outward from exterior side surfaces of said latch beams, said locking protrusions being spaced from said body by a distance sufficient for said locking protrusions to clear said interior walls of said window and engage said bottom surface of said socket cover.

15. The electronic socket assembly of claim 9, wherein said corners are smooth and formed as right angles at points of intersection between adjoining interior walls.

16. The electronic socket assembly of claim 9, wherein said interior walls of said window include planar surfaces that intersect said bottom surface of said socket cover to form linear, even edges surrounding said window.

17. The electronic socket assembly of claim 9, wherein said interior walls of said window include planar, non-recessed surfaces.

18. The electronic socket assembly of claim 9, wherein said interior walls surrounding said window have even and non-recessed surfaces.

19. The electronic socket assembly of claim 9, wherein said window includes at least one cutout notched in a peripheral side of said socket cover.

20. The electronic socket assembly of claim 9, wherein said latch beam includes a latch surface that projects past the interior wall of the window, said latch surface engaging the bottom surface of the socket cover after clearing the interior wall of the window.

21. A transport cover, connectable to an electrical socket having a socket cover with a window therethrough, the window being surrounded by interior walls intersecting at corners, the transport cover comprising:

a body having a top surface configured to be engaged by a transport tool and having a bottom surface configured to abut against a surface of an electronic socket;

locating posts provided on said bottom surface of said body, said locating posts being positioned on said body and separated from one another to align with at least two of said corners of said window; and latch beams provided on said bottom surface of said body, said latch beams being positioned on said body and separated from one another to align with at least two of said interior walls, said latch beams being configured to snappably engage a bottom surface of said socket cover proximate corresponding interior walls, wherein said latch beams are configured to engage even, non-recessed surfaces of said interior walls of said window and said bottom surface of said socket cover.

22. A transport cover connectable to an electrical socket having a socket cover with a window therethrough, the window being surrounded by interior walls intersecting at corners the transport cover comprising:

a body having a top surface configured to be engaged by a transport tool and having a bottom surface configured to abut against a surface of an electronic socket;

at least one latch post provided on said bottom surface of said body, and at least one latch beam provided on said bottom surface of said body, said latch beam being configured to snappably engage a bottom surface of said socket cover proximate a corresponding interior wall wherein said bottom surface of said body includes a contact rib that engages a top surface of an electrical component to maintain a space between said bottom surface of said body and a top surface of the electrical component.

23. A transport cover connectable to a socket cover having a window that extends between top and bottom surfaces of the socket cover, the window having interior walls, the transport cover comprising:

a body having top and bottom surfaces;

a locating post provided on said bottom surface of said body; and a latch beam provided on said bottom surface of said body, said latch beam being configured to extend through the window into the socket cover and project past a corresponding interior wall of the window in the socket cover until said latch beam snappably engages the bottom surface of the socket cover.

24. The transport cover of claim 23, wherein said latch beam projects past a non-recessed surface of the corresponding interior wall of the window.

25. An electric socket assembly, comprising:

a socket having a socket base slidably mounted to a socket cover, said socket cover having a window that extends between top and bottom surfaces of said socket cover, said window including interior walls; and a transport cover detachably mounted to said socket, said transport cover having a bottom surface with a locating post, a latch beam, and a contact rib thereon, said locating post being received within said window proximate a corner where said interior walls intersect, said latch beam projecting past a continuous and uninterrupted portion of a corresponding one of said interior wall; said contact rib extending proximate at least one of a side wall and an end wall of said transport cover, said contact rib engaging said top surface of said socket cover.

* * * * *